(12) United States Patent
Chernetsov et al.

(10) Patent No.: US 9,021,349 B1
(45) Date of Patent: Apr. 28, 2015

(54) SYSTEM, METHOD, AND COMPUTER PROGRAM PRODUCT FOR IDENTIFYING DIFFERENCES IN A EDA DESIGN

(75) Inventors: Sergey Chernetsov, Nepean (CA); Robert Roesler, Fitzroy Harbour (CA)

(73) Assignee: Cadence Design Systems, Inc., San Jose, CA (US)

( * ) Notice: Subject to any disclaimer, the term of this patent is extended or adjusted under 35 U.S.C. 154(b) by 508 days.

(21) Appl. No.: 13/456,115

(22) Filed: Apr. 25, 2012

(51) Int. Cl.
*G06F 17/24* (2006.01)

(52) U.S. Cl.
CPC .................................. *G06F 17/248* (2013.01)

(58) Field of Classification Search
CPC ...................................................... G06F 17/248
USPC ....................................................... 715/235
See application file for complete search history.

(56) References Cited

U.S. PATENT DOCUMENTS

| | | | | |
|---|---|---|---|---|
| 6,634,008 | B1 * | 10/2003 | Dole | 716/55 |
| 6,711,731 | B2 * | 3/2004 | Weiss | 700/121 |
| 6,757,882 | B2 * | 6/2004 | Chen et al. | 716/102 |
| 7,770,113 | B1 * | 8/2010 | Anderson et al. | 715/272 |
| 8,046,206 | B1 * | 10/2011 | Hood et al. | 703/13 |
| 8,209,648 | B1 * | 6/2012 | Ku et al. | 716/108 |
| 8,612,916 | B1 * | 12/2013 | O'Higgins et al. | 716/122 |
| 2002/0166100 | A1 * | 11/2002 | Meding | 716/5 |
| 2002/0173867 | A1 * | 11/2002 | Duncan et al. | 700/97 |
| 2003/0014725 | A1 * | 1/2003 | Sato et al. | 716/10 |
| 2003/0025734 | A1 * | 2/2003 | Boose et al. | 345/765 |
| 2003/0167446 | A1 * | 9/2003 | Thomas | 715/513 |
| 2003/0229482 | A1 * | 12/2003 | Cook et al. | 703/14 |
| 2004/0153469 | A1 * | 8/2004 | Keith-Hill | 707/101 |
| 2004/0181561 | A1 * | 9/2004 | Knox et al. | 707/203 |
| 2004/0205617 | A1 * | 10/2004 | Light | 715/523 |
| 2005/0132306 | A1 * | 6/2005 | Smith et al. | 716/1 |
| 2006/0218160 | A1 * | 9/2006 | Bhatia | 707/100 |
| 2007/0240035 | A1 * | 10/2007 | Sthanikam et al. | 715/513 |
| 2008/0098349 | A1 * | 4/2008 | Lin et al. | 717/106 |
| 2009/0307639 | A1 * | 12/2009 | Chapman et al. | 716/4 |
| 2010/0036776 | A1 * | 2/2010 | Musharbash | 705/400 |
| 2010/0070935 | A1 * | 3/2010 | Bist et al. | 716/4 |
| 2010/0070940 | A1 * | 3/2010 | Bist et al. | 716/5 |
| 2012/0109905 | A1 * | 5/2012 | Tingstrom et al. | 707/690 |

OTHER PUBLICATIONS

Geppert, Linda. "Electronic design automation [Technology 2000 analysis and forecast]." Spectrum, IEEE 37, No. 1 (2000): 70-74.*
Yuan, Jun, Carl Pixley, and Adnan Aziz. Constraint-Based Verification. Springer Science & Business Media, 2006, p. 1-52.*

* cited by examiner

*Primary Examiner* — Frank D Mills
(74) *Attorney, Agent, or Firm* — Holland & Knight LLP; Mark H. Whittenberger, Esq.

(57) ABSTRACT

The present disclosure relates to a computer-implemented method for generating an electronic design automation differences report is provided. The method may include modifying instructions configured to generate a report of an electronic design and generating a data file based upon, at least in part, the modified instructions. The method may further include converting the data file to a second data file using, at least in part, the template. The method may also include generating a report viewer, based upon, at least in part, the second data file.

24 Claims, 12 Drawing Sheets

Modifying, using a computing device, instructions configured to generate a report of an electronic design

202

Generating, using the computing device, a data file based upon, at least in part, the modified instructions

204

Converting, using the computing device, the data file to a second data file using, at least in part, the template

206

Generating, using the computing device, a report viewer, based upon, at least in part, the second data file

Report summary

| Report time | Wed Feb 29 14:06:58 2012 |
|---|---|
| Software version | unrelease_unrelease |
| Schematic | Design: load.dst |
| Layout | C:\home\CCRs\enhancements\DD\rearchitecture\diff3\testcase\load.src.dcf |
| Baseline File | C:\home\CCRs\enhancements\DD\rearchitecture\diff3\testcase\load.base.dcf |
| Update Mode | Report Only |
| Update Mode | Diff3 |
| Constraint Information | CrossSection, Electrical, Physical, Spacing, Same Net Spacing, Properties |

Summary

| Object type | Total changed objects |
|---|---|
| NetClasses | 1 |
| ConstraintSets | PhysicalCSet: 3, SpacingCSet: 1, ElectricalCSet: 3 |

ConstraintSets

Top

| Object type | Total changed objects |
|---|---|
| ElectricalCSets | 3 |
| PhysicalCSets | 3 |
| SpacingCSets | 1 |

ElectricalCSets

Top

| Object name | Membership changes | Reference changes | Attribute changes | Notes | Status |
|---|---|---|---|---|---|
| DATA_ADDR | 0 | 0 | 4 | 0 | Change |
| DIFF_MATCH | 0 | 0 | 3 | 0 | Change |
| DIFF | 0 | 0 | 5 | 0 | Change |

ElectricalCSet: DATA_ADDR

Top ElectricalCSets

Attribute changes:

FIG. 6

| Attribute name | Schematic | Layout | Base | Status |
|---|---|---|---|---|
| MAX_FINAL_SETTLE | Schematic | Layout 2.000 | Base | Add |
|  |  | 5.000 |  |  |
| MAX_OVERSHOOT | Schematic 5.000 | Layout 5.000 | Base | Conflict |
|  | 3.000 | 4.000 |  |  |
| MIN_FIRST_SWITCH | Schematic | Layout 2.000 | Base | Add |
|  |  | 5.000 |  |  |
| MIN_NOISE_MARGIN | Schematic 3.000 | Layout 2.000 | Base | Conflict |
|  | 3.000 | 2.000 |  |  |

ElectricalCSet: DIFF

Top ElectricalCSets

Attribute changes:

| Attribute name | Schematic | Layout | Base | Status |
|---|---|---|---|---|
| MAX_FINAL_SETTLE | Schematic 5.000 | Layout 2.000 | Base | Conflict |
|  | 5.000 | 4.000 |  |  |
| MAX_OVERSHOOT | Schematic 3.000 | Layout 3.000 | Base | Conflict |
|  | 3.000 | 4.000 |  |  |
| MAX_VIA_COUNT | 7 | 1 |  | Conflict |
| MIN_FIRST_SWITCH | Schematic 2.000 | Layout 3.000 | Base | Conflict |
|  | 2.000 | 4.000 |  |  |
| MIN_NOISE_MARGIN | Schematic 2.000 | Layout 3.000 | Base | Conflict |

| Attribute name | Schematic | Layout | Base | Status |
|---|---|---|---|---|
|  | *SCHEMATIC* | Layout | Base |  |
|  | 2.000 | 3.000 |  |  |

ElectricalCSet: DIFF_MATCH

Top ElectricalCSets

Attribute changes:

| Attribute name | Schematic | Layout | Base | Status |
|---|---|---|---|---|
| MAX_FINAL_SETTLE | *SCHEMATIC* | Layout | Base | Conflict |
|  | 4.000 | 2.000 |  |  |
|  | 4.000 | 3.000 |  |  |
| MIN_FIRST_SWITCH | *SCHEMATIC* | Layout | Base | Conflict |
|  | 3.000 | 4.000 |  |  |
|  | 3.000 | 5.000 |  |  |
| MIN_NOISE_MARGIN | *SCHEMATIC* | Layout | Base | Conflict |
|  | 3.000 | 4.000 |  |  |
|  | 3.000 | 4.000 |  |  |

PhysicalCSets

Top

| Object name | Membership changes | Reference changes | Attribute changes | Notes | Status |
|---|---|---|---|---|---|
| DEFAULT | 0 | 0 | 4 | 0 | Change |
| 5 MIL | 0 | 0 | 1 | 0 | Change |
| HOSTCLOCKS | 0 | 0 | 2 | 0 | Change |

PhysicalCSet: 5 MIL

Top PhysicalCSets

Attribute changes:

| Attribute name | Schematic | Layout | Base | Status |
|---|---|---|---|---|
| VIA_LIST | *SCHEMATIC* | Layout | Base | Conflict |

| Attribute name | Schematic | | | Layout | | Base | Status |
|---|---|---|---|---|---|---|---|
| | *SCHEMATIC* | Layout | Base | | | | |
| | *C25P14* | *C25P14* | *C25P14* | | | | |
| | 60X100 | C20P10 | C20P10 | | | | |
| | 60X50 | 60X100 | | | | | |
| | C20P10 | 60X60 | | | | | |

PhysicalCSet: DEFAULT

Top PhysicalCSets

Attribute changes:

| Attribute name | Schematic | | | | Layout | Base | Stat |
|---|---|---|---|---|---|---|---|
| ALLOW_ON_ETCH_SUBCLASS | Layer name | *SCHEMATIC* | Layout | Base | | | Conf |
| | TOP | FALSE | TRUE | TRUE | | | |
| | GND | FALSE | TRUE | TRUE | | | |
| | INNER1 | FALSE | FALSE | TRUE | | | |
| | PWR1 | FALSE | TRUE | TRUE | | | |
| | PWR2 | FALSE | TRUE | TRUE | | | |
| | INNER2 | FALSE | TRUE | TRUE | | | |
| | GND2 | FALSE | TRUE | TRUE | | | |
| | BOTTOM | FALSE | TRUE | TRUE | | | |
| PAD_PAD_DIRECT_CONNECT | *VIAS_VIAS_ONLY* | | | NOT_ALLOWED | | ALL_ALLOWED | Conf |
| TS_ALLOWED | *PINS_ONLY* | | | PINS_VIAS_ONLY | | ANYWHERE | Conf |
| VIA_LIST | *SCHEMATIC* | | | Layout | | Base | Conf |
| | *C25P14* | | | *C25P14* | | *C25P14* | |
| | *C20P10* | | | *C20P10* | | *C20P10* | |
| | CAPP2_PAD1_PAD1 | | | PAD93CIR53D | | | |
| | BGAPAD | | | | | | |

PhysicalCSet: HOSTCLOCKS

Top PhysicalCSets

Attribute changes:

| Attribute name | Schematic | Layout | Base | Status |
|---|---|---|---|---|

FIG. 9

| Attribute name | Schematic | Layout | Base | Status |
|---|---|---|---|---|
| ALLOW_ON_ETCH_SUBCLASS | TRUE | FALSE | TRUE | Change |
| VIA_LIST | Schematic C20P10 CAPP2_PAD1_PAD1 BONDPAD_WBU | Layout C20P10 CAPP2_PAD1_PAD1 C18 | Base C20P10 | Conflict |

SpacingCSets

Top

| Object name | Membership changes | Reference changes | Attribute changes | Notes | Status |
|---|---|---|---|---|---|
| 12 MIL | 0 | 0 | 3 | 0 | Change |

SpacingCSet: 12 MIL

Top SpacingCSets

Attribute changes:

| Attribute name | Schematic | Layout | Base | Status |
|---|---|---|---|---|
| BBV_TO_LINE_SPACING | Layer name / TOP / GND / INNER1 / PWR1 / PWR2 / INNER2 / GND2 / BOTTOM | Schematic 5.00 / 5.00 / 5.00 / 5.00 / 5.00 / 5.00 / 5.00 / 5.00 | *LAYOUT* 5.00 / 5.00 / 2.00 / 5.00 / 5.00 / 5.00 / 5.00 / 5.00 | Base 5.00 / 5.00 / 5.00 / 5.00 / 5.00 / 5.00 / 5.00 / 5.00 | Change |
| LINE_TO_LINE_SPACING | Layer name / TOP / GND / INNER1 / PWR1 / PWR2 / INNER2 | Schematic 12.00 / 12.00 / 12.00 / 12.00 / 12.00 / 12.00 | *LAYOUT* 12.00 / 12.00 / 12.00 / 2.00 / 12.00 / 12.00 | Base 12.00 / 12.00 / 12.00 / 12.00 / 12.00 / 12.00 | Change |

SYSTEM, METHOD, AND COMPUTER PROGRAM PRODUCT FOR IDENTIFYING DIFFERENCES IN A EDA DESIGN

FIELD OF THE INVENTION

The present disclosure relates to electronic design automation, and more specifically, to a method for generating an electronic design automation differences report.

DISCUSSION OF THE RELATED ART

Electronic design automation (EDA) utilizes software tools that may be used in the design and analysis of numerous electronic systems such as printed circuit boards (PCBs) and integrated circuits (ICs). Modern EDA trends incorporate concurrent design, thus increasing the demand for comparing the design at various stages and analyzing the changes introduced by each team or engineer. Original design differencing representation, which appeared together with design comparing engines, results in a flat text-file report that is rapidly becoming less and less comprehensible and usable with the growing complexity and volume of EDA designs. Numerous aspects of the electronics design flow are addressed by various tools each having their own differencing engines and ways to present differences to the user. Recent trends in non-EDA products often involve the use of crystal reports and similar solutions. However, these approaches involve third-party software, jeopardize the cross-platform applicability of the EDA tools in question and require more report-generating code changes.

SUMMARY OF INVENTION

In one or more embodiments of the present disclosure, a computer-implemented method for generating an electronic design automation differences report is provided. The method may include modifying instructions configured to generate a report of an electronic design and generating a data file based upon, at least in part, the modified instructions. The method may further include converting the data file to a second data file using, at least in part, a template. The method may also include generating a report viewer, based upon, at least in part, the second data file.

One or more of the following features may be included. In some embodiments, the template may be an Extensible Stylesheet Language (XSL) file. In some embodiments, the data file may be an Extensible Markup Language (XML) file. In some embodiments, the second data file may be an Extensible Markup Language (XML) file. In some embodiments, generating the report viewer may include modifying instructions configured to render an electronic design automation differences report. In some embodiments, the report viewer may be a web browser-based report viewer. In some embodiments, the template may be an electronic design automation template.

In some embodiments, generating the report viewer may include providing an option of one or more viewing modes. The one or more viewing modes may include at least one of an analysis mode and a printer mode.

In one or more embodiments of the present disclosure, a system for generating an electronic design automation differences report is provided. The system may include a computing device having at least one processor configured to modify instructions configured to generate a report of an electronic design. In some embodiments, the at least one processor may be further configured to generate a data file based upon, at least in part, the modified instructions. In some embodiments, the at least one processor may be further configured to convert the data file to a second data file using, at least in part, the template. In some embodiments, the at least one processor may be further configured to generate a report viewer, based upon, at least in part, the second data file.

One or more of the following features may be included. In some embodiments, the template may be an Extensible Stylesheet Language (XSL) file. In some embodiments, the data file may be an Extensible Markup Language (XML) file. In some embodiments, the second data file may be an Extensible Markup Language (XML) file. In some embodiments, generating the report viewer may include modifying instructions configured to render an electronic design automation differences report. In some embodiments, the report viewer may be a web browser-based report viewer. In some embodiments, the template may be an electronic design automation template.

In some embodiments, generating the report viewer may include providing an option of one or more viewing modes. The one or more viewing modes may include at least one of an analysis mode and a printer mode.

In one or more embodiments of the present disclosure, a computer-readable storage medium for generating an electronic design automation differences report is provided. The computer-readable storage medium may have stored thereon instructions that when executed by a machine result in one or more operations. Operations may include modifying instructions configured to generate a report of an electronic design and generating a data file based upon, at least in part, the modified instructions. The method may further include converting the data file to a second data file using, at least in part, a template. The method may also include generating a report viewer, based upon, at least in part, the second data file.

One or more of the following features may be included. In some embodiments, the template may be an Extensible Stylesheet Language (XSL) file. In some embodiments, the data file may be an Extensible Markup Language (XML) file. In some embodiments, the second data file may be an Extensible Markup Language (XML) file. In some embodiments, generating the report viewer may include modifying instructions configured to render an electronic design automation differences report. In some embodiments, the report viewer may be a web browser-based report viewer. In some embodiments, the template may be an electronic design automation template.

In some embodiments, generating the report viewer may include providing an option of one or more viewing modes. The one or more viewing modes may include at least one of an analysis mode and a printer mode.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Figure 1:
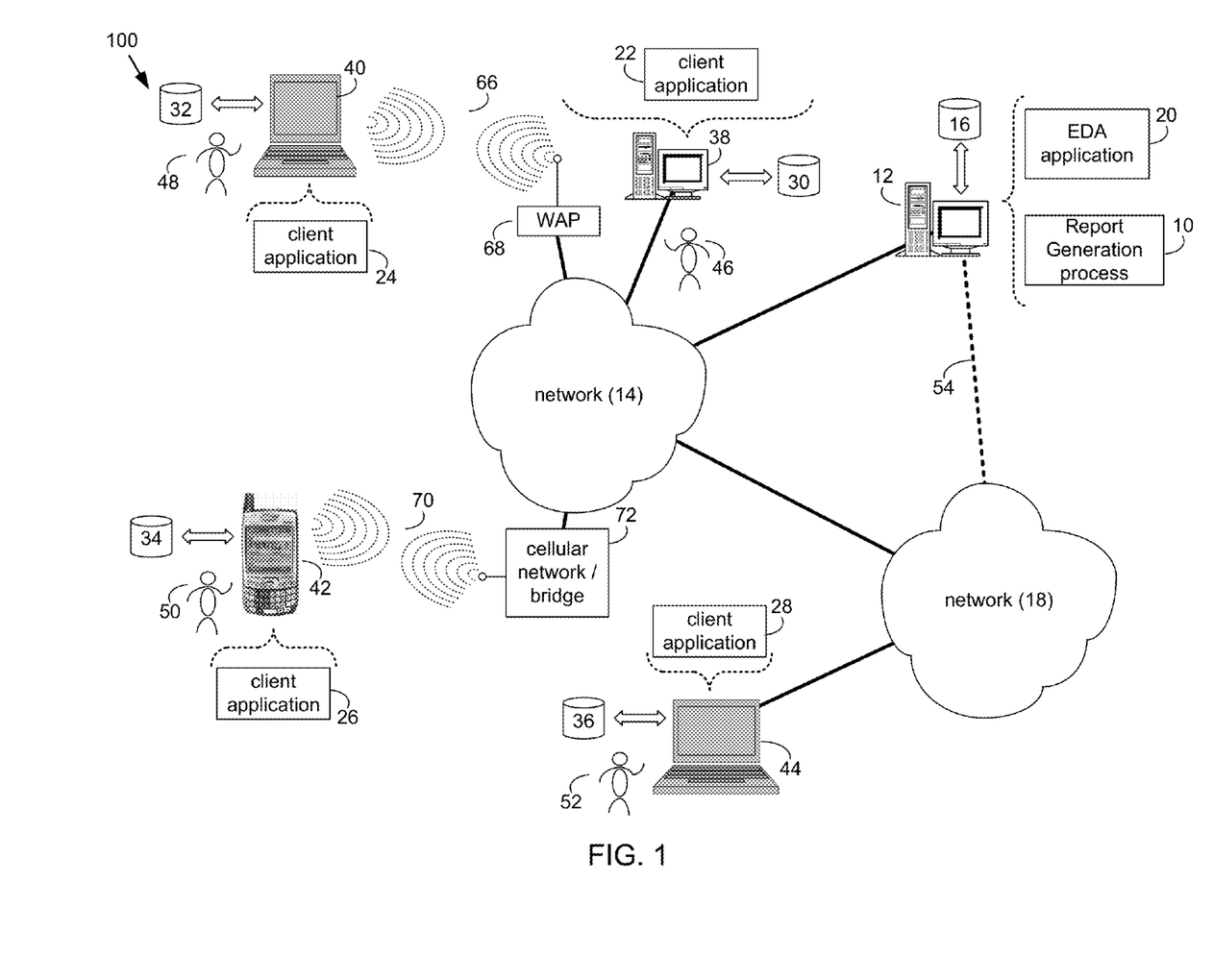
FIG. 1 is a system diagram depicting aspects of the report generation process in accordance with an embodiment of the present disclosure.

Referring to FIG. 1, there is shown report generation process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the report generation process may reside on and be executed, in whole or in part, by a client electronic device, such as a personal computer, notebook computer, personal digital assistant, or the like.

Figure 2:
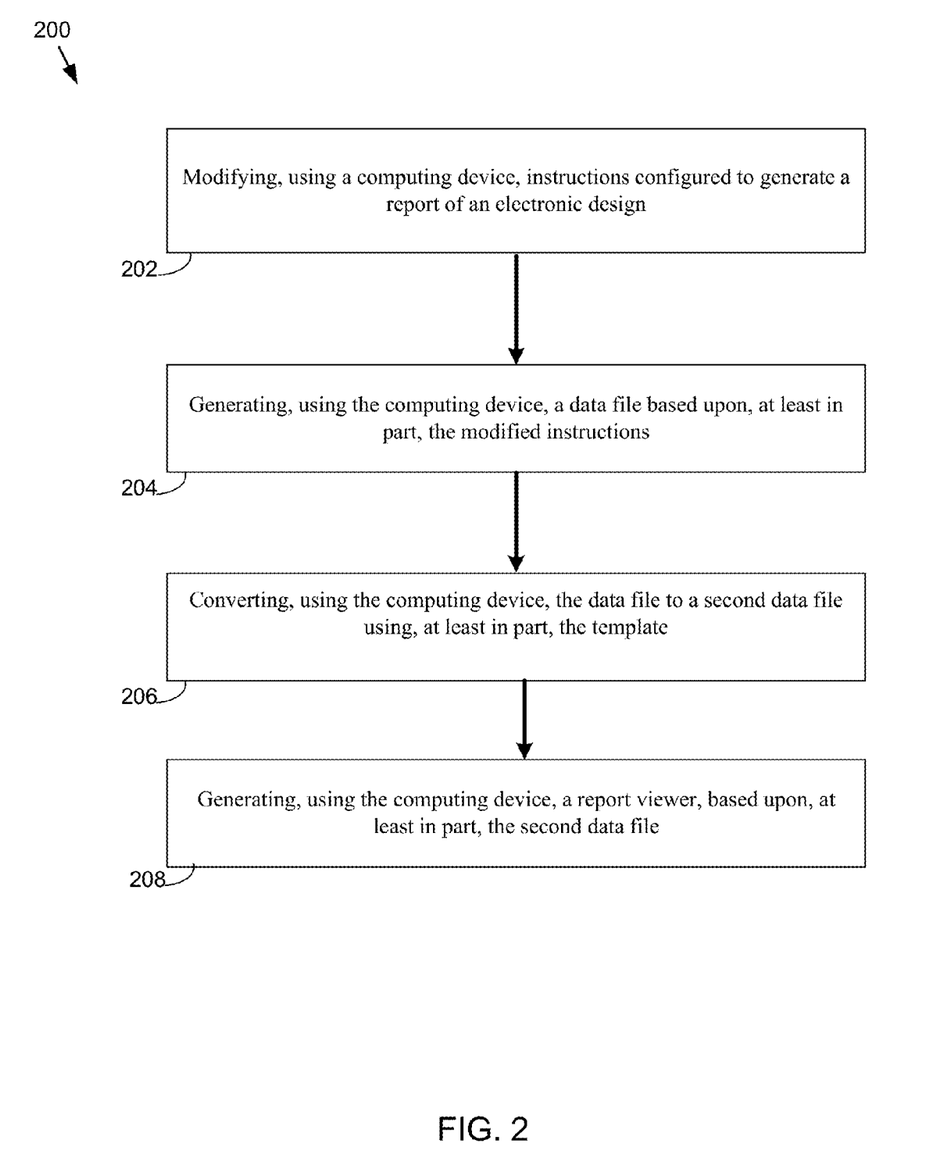
FIG. 2 is a flowchart depicting operations consistent with the report generation process of the present disclosure.

As will be discussed below in greater detail, report generation process 10 may include a method for generating an electronic design automation differences report. The method may include modifying (202) instructions configured to generate a report of an electronic design and generating (204) a data file based upon, at least in part, the modified instructions. The method may further include converting (206) the data file to a second data file using, at least in part, a template. The method may also include generating (208) a report viewer, based upon, at least in part, the second data file.

The instruction sets and subroutines of report generation process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Report generation process 10 may be a stand alone application, or may be an applet/application/script that may interact with and/or be executed within EDA application 20. In addition/as an alternative to being a server-side process, the report generation process may be a client-side process (not shown) that may reside on a client electronic device (described below) and may interact with an EDA client application (e.g., one or more of EDA client applications 22, 24, 26, 28). Further, the report generation process may be a hybrid server-side/client-side process that may interact with EDA application 20 and an EDA client application (e.g., one or more of client applications 22, 24, 26, 28). As such, the report generation process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize report generation process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., 0) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 3:
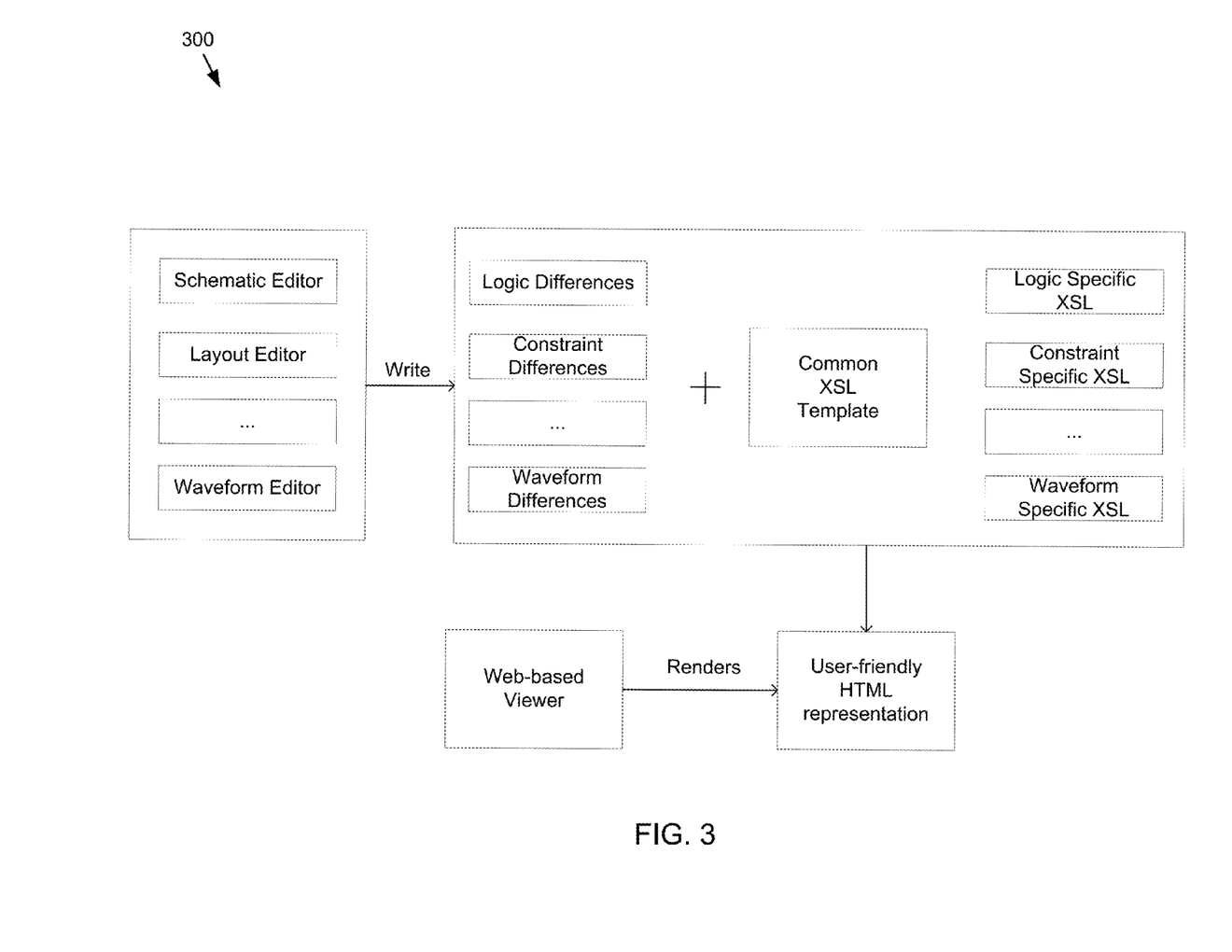
FIG. 3 is a diagram depicting aspects of the report generation process in accordance with an embodiment of the present disclosure.

Referring now to FIG. 3, a flow diagram 300 depicting operations consistent with an embodiment of report generation process 10 is provided. As discussed above, report generation process 10 may include a method for generating an electronic design automation differences report. Embodiments described herein may allow for improved design constraint differences report (e.g. printed circuit board (PCB), integrated circuit (IC), etc.), which may be generated in extremely short periods of time. Embodiments described herein enable changing the reports with only minimal changes required to the report-generating code. Utilization of the embodiments described herein may allow for rendering a user-friendly and navigable report.

The report generation process described herein provides a platform-independent solution, which may align with various cross-platform EDA tools. In some embodiments, report generation process 10 may be configured to represent EDA design differences in a user-friendly web-page-like format, which may include numerous features, some of which may include, but are not limited to, data hiding techniques, cross navigation, and cross-probing into the host application and managing the differences (e.g. resolving the conflicts). Report generation process 10 may include engine and scalable rendering templates, which may be tool-independent and may simplify the transition from the ASCII reports that existing EDA tools generate.

In some embodiments, report generation process 10 may include modifying (202) instructions configured to generate a report of an electronic design. For example, diagram 300 depicts one or more EDA tools, some of which may include, but are not limited to, schematic editors, layout editors, waveform editors, etc. Schematic editors may provide the ability to capture electrical properties and numerous components of wires, nets, and pins as well as the ability to generate netlists of the designated circuit. Schematic editors may be configured to input designs from formats such as VHSIC hardware description language (VHDL), Verilog, Electronic Design Interchange Format (EDIF), etc. Some of these tools may be available from the assignee of the present disclosure and may be capable of providing code configured to generate a report of the differences associated with a design.

Figure 5:
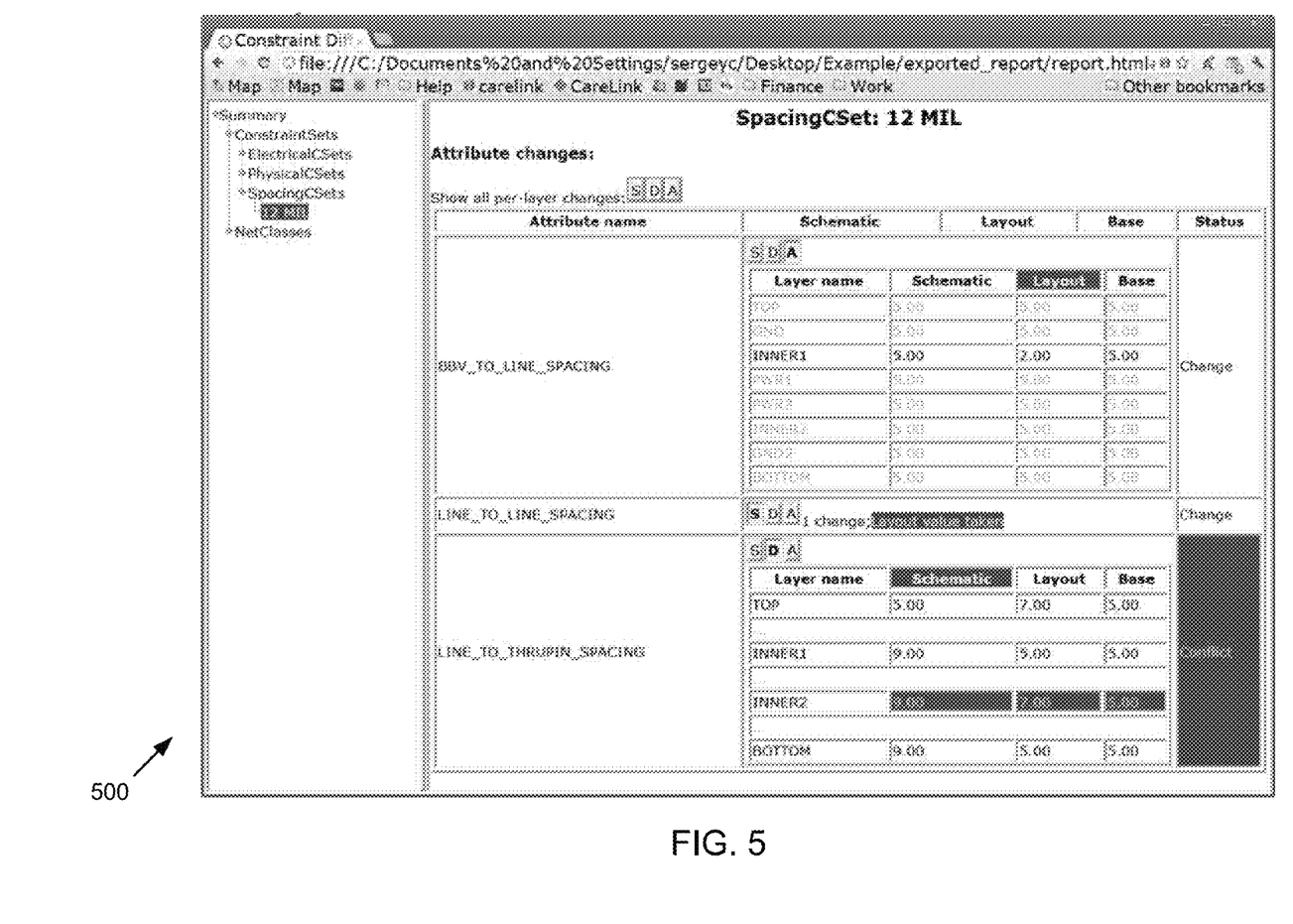
FIG. 5 is a diagram depicting an example of a report generated and exported in accordance with an embodiment of the present disclosure.
Figure 6:
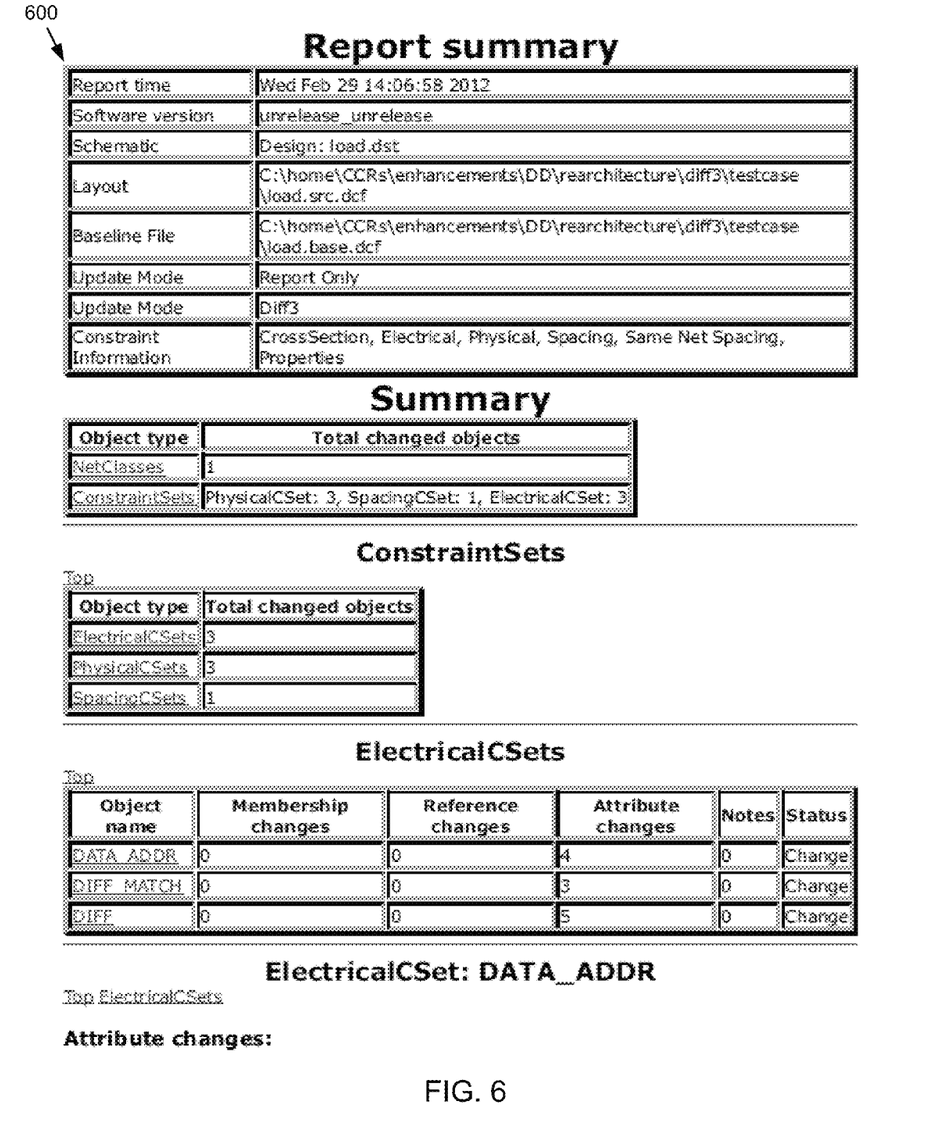
FIG. 6 is a diagram depicting an example of a report generated in accordance with an embodiment of the present disclosure.
Figure 7:
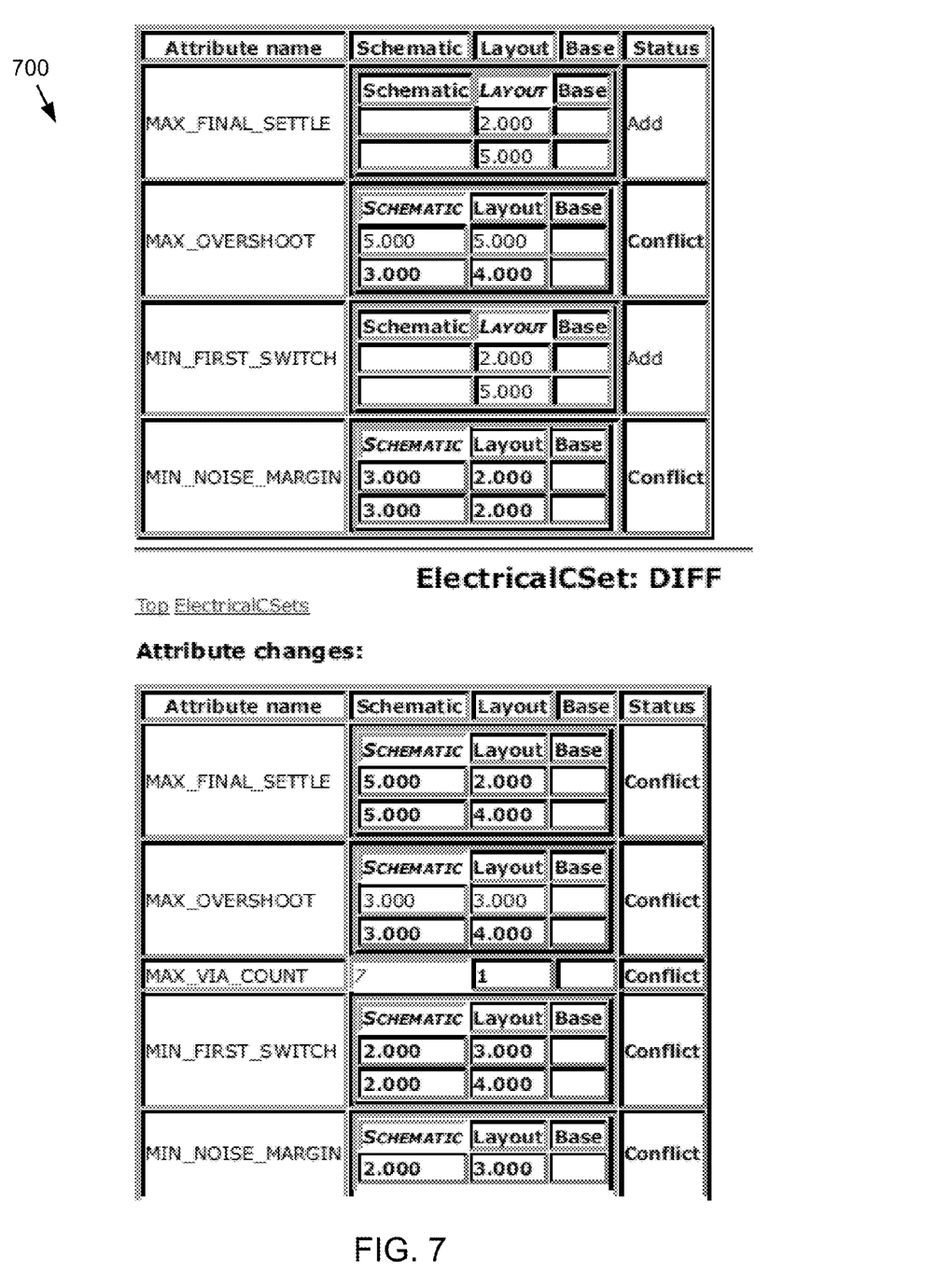
FIG. 7 is a diagram depicting an example of a report generated in accordance with an embodiment of the present disclosure.
Figure 8:
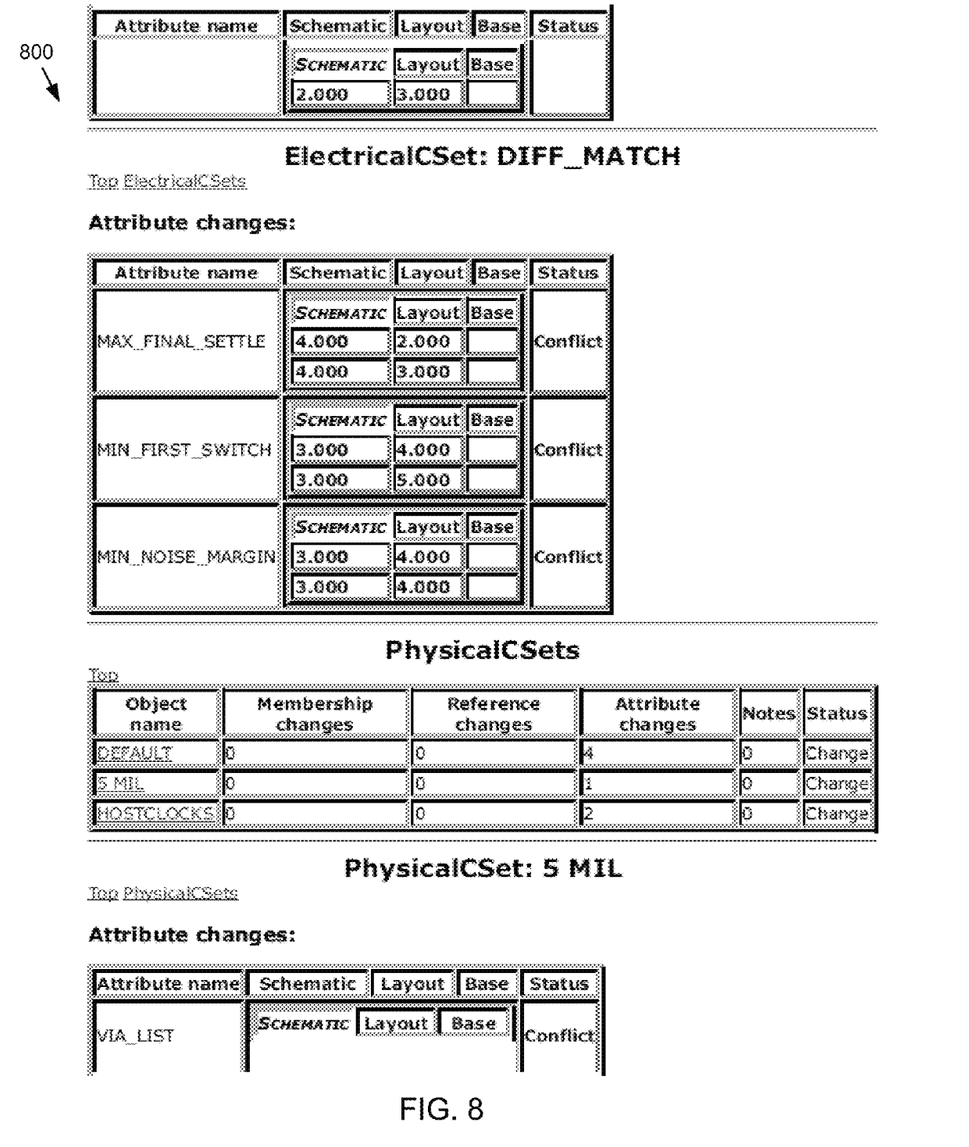
FIG. 8 is a diagram depicting an example of a report generated in accordance with an embodiment of the present disclosure.
Figure 9:
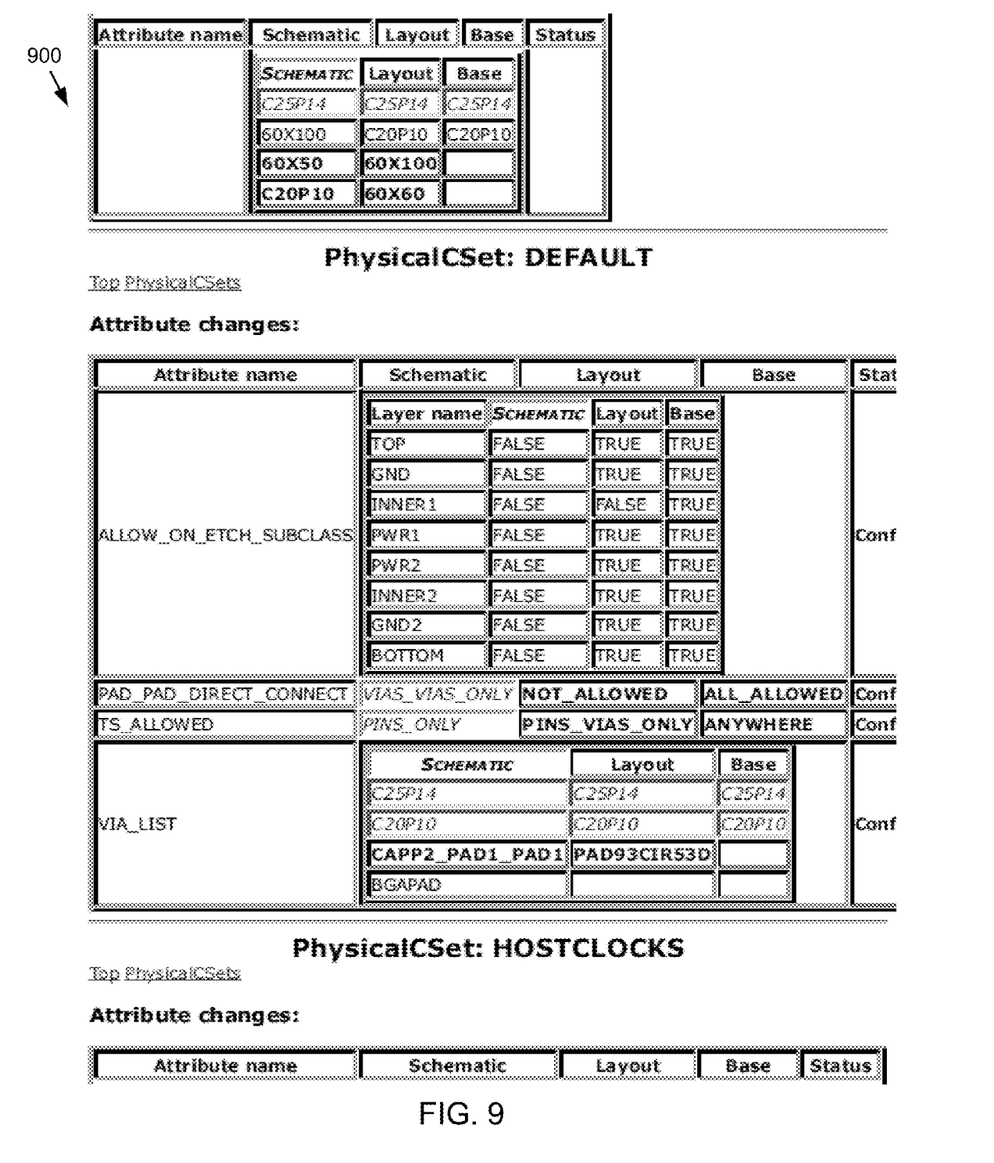
FIG. 9 is a diagram depicting an example of a report generated in accordance with an embodiment of the present disclosure.
Figure 10:
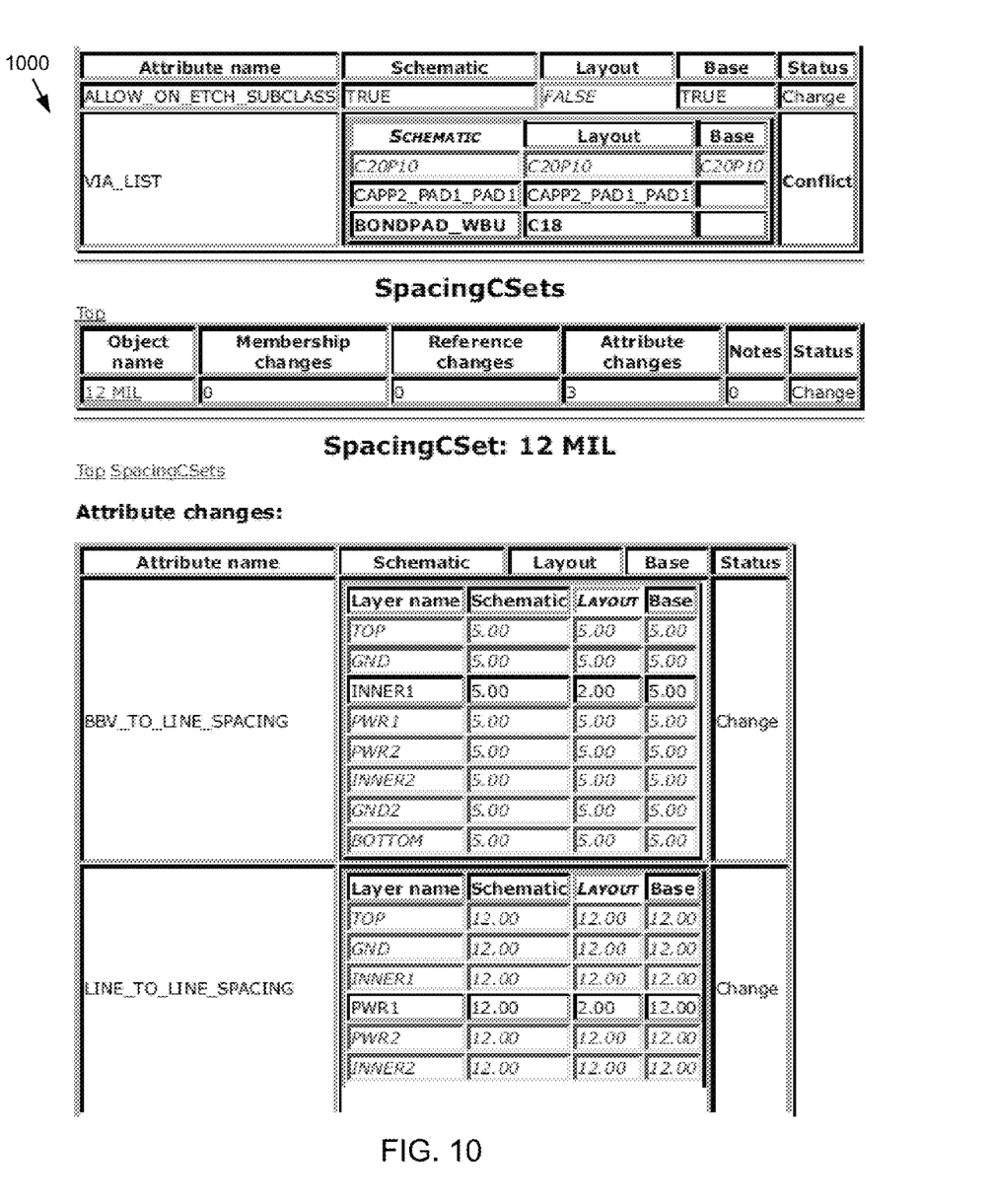
FIG. 10 is a diagram depicting an example of a report generated in accordance with an embodiment of the present disclosure.
Figure 11:
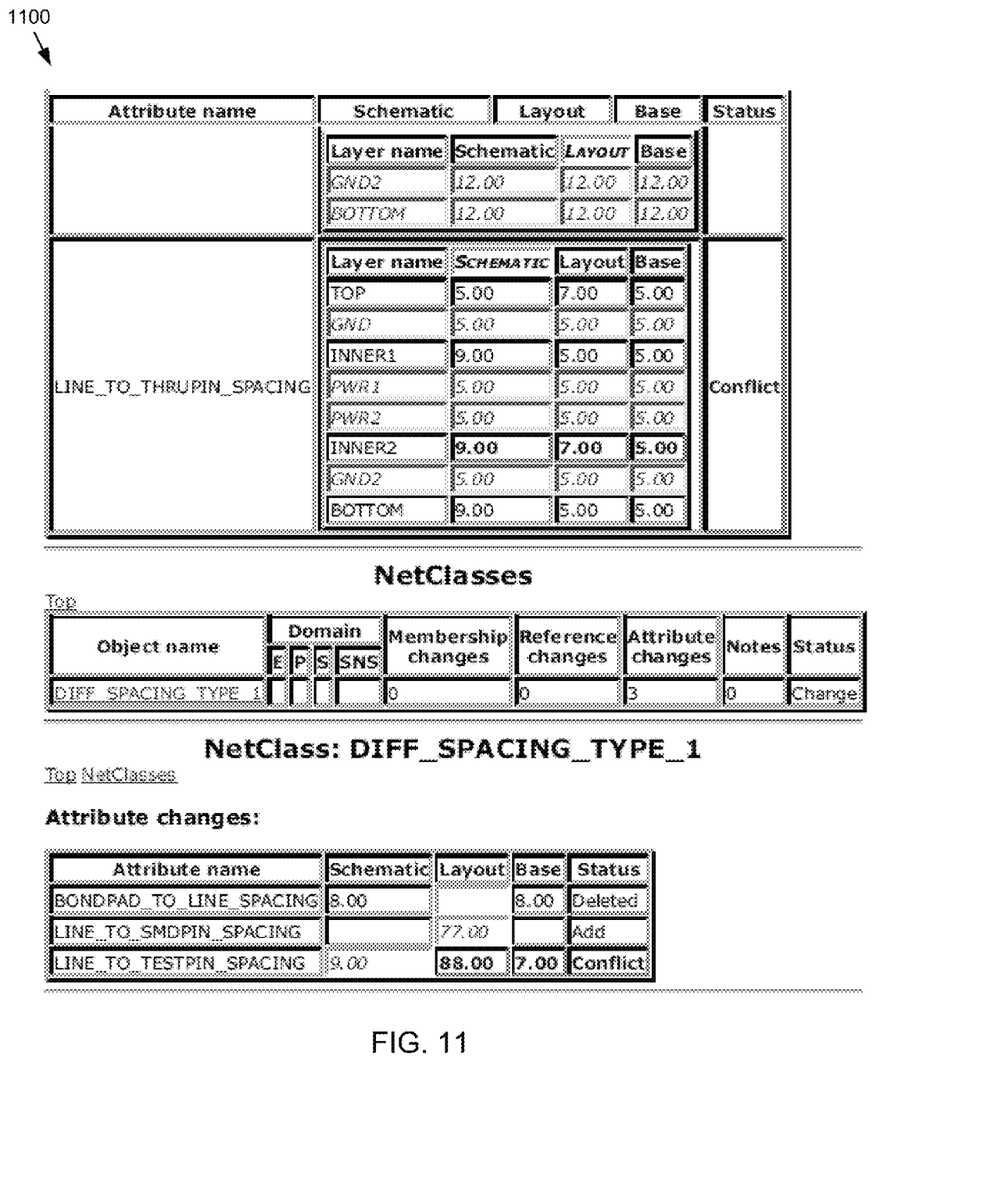
FIG. 11 is a diagram depicting an example of a report generated in accordance with an embodiment of the present disclosure.
Figure 12:
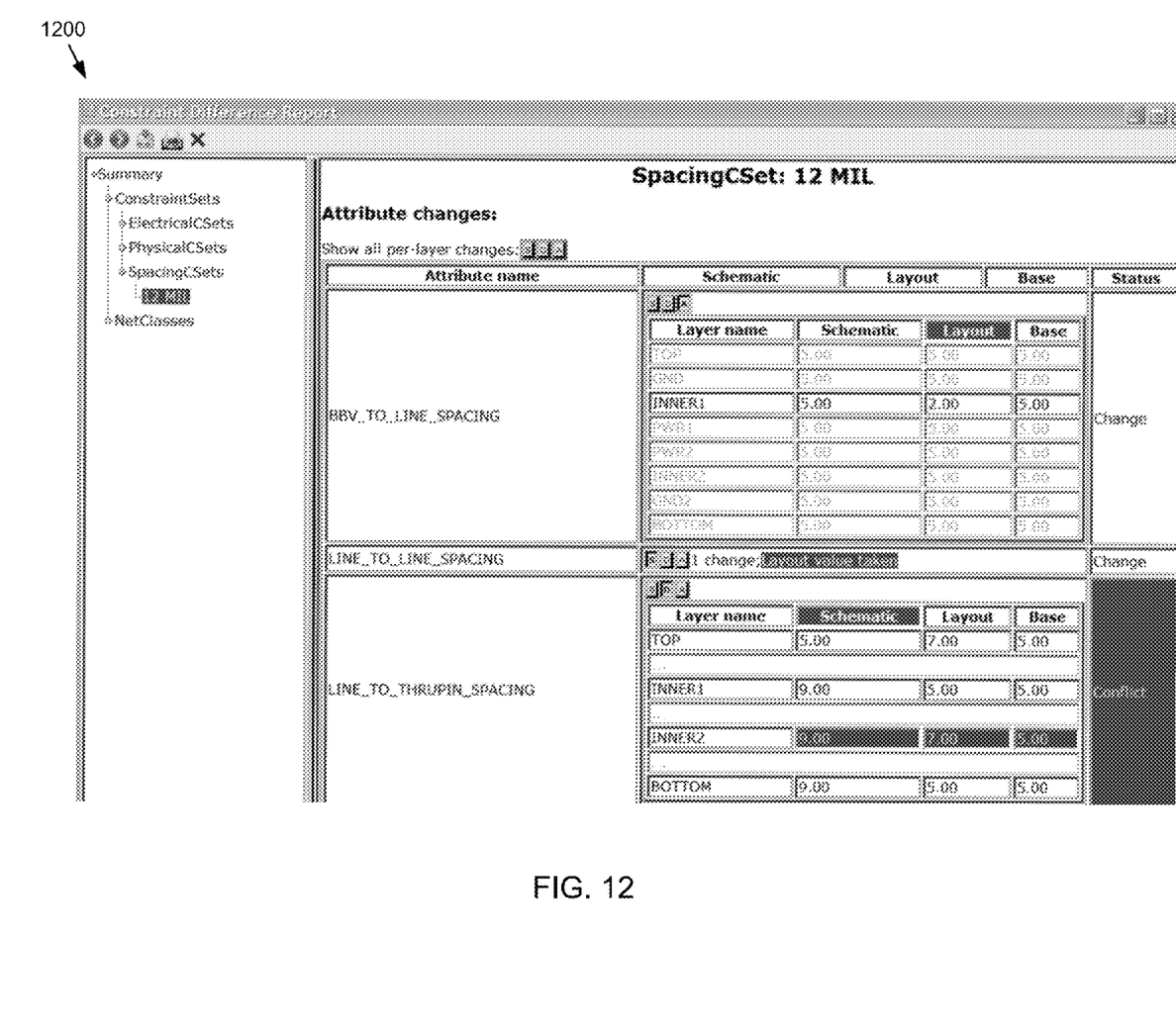
FIG. 12 is a diagram depicting an example of a report generated and rendered by a custom viewer in accordance with an embodiment of the present disclosure.

Accordingly, report generation process 10 may be configured to modify report generation code in order to generate (204) a data file (e.g., an Extensible Markup Language (XML) file) containing the data that needs to be reported. Report generation process 10 may allow for integration into existing EDA tools by generating/rendering XML-based reports. In some embodiments, a common web-based (e.g. Firefox) report viewer may be responsible for rendering, printing and exporting XML reports (see, e.g. FIG. 5) written by various EDA tools.

In some embodiments, report generation process 10 may be configured to convert (206) the data file to a second data file using, at least in part, a template. The template may be an Extensible Stylesheet Language (XSL) file and the second data file may be an Extensible Markup Language (XML) file. Numerous other file types are also within the scope of the present disclosure.

Accordingly, report generation process 10 may utilize this developed XSL file in order to convert XML-based report into a user-friendly HTML or HTML-like page. Thus, using XSL transformations, an EDA report written in a EDA-compliant format may be transformed into a user-friendly HTML page. Additionally and/or alternatively, added scalability may be achieved using nested XSL templates (i.e., specific templates reusing portions of general-purpose templates, thus leveraging the degree of individuality of each particular report).

As discussed above, in some embodiments, report generation process 10 may be configured to generate (208) a report viewer, based upon, at least in part, the second data file. As discussed above, the second data file may be an XML file. In some embodiments, generating the report viewer may include modifying instructions configured to render an electronic design automation differences report. The report viewer may be a web browser-based report viewer (e.g. Firefox application, etc.). In some embodiments, the user may be provided with an option of one or more viewing modes (e.g. analysis mode, printer mode, etc.). In this way, report generation process 10 may utilize a custom report viewer (e.g. a Firefox application, etc). Accordingly, report generation process 10 may write a raw XML file, which may be more convenient for the application. As discussed above, report generation process may utilize XSL transformations to convert a raw XML into a web-page, and may utilize the custom viewer in order to add extra functionality to the report.

Accordingly, report generation process 10 may be used across a variety of platforms by using HTML, which can be viewed in various browsers on any platform. In the event that a specific functionality is required (e.g., cross-probing back to calling EDA tool), report generation process 10 may write a report viewer application (e.g. Firefox application), which may add some specific functionalities not available in standard browsers. In some embodiments, report generation process 10 may be configured to modify the report rendering code (if any) to launch a common HTML browser-based report viewer (e.g. a browser) instead of rendering a text file or opening it in a text.

As discussed above, in some embodiments, the EDA design difference report may be represented in a form of a web-page to be rendered in a web-browser or a specialized viewer. The differences may be grouped by various parameters so as to allow the user to concentrate on a particular portion of the differences, all the data irrelevant to this portion may be hidden. Additionally and/or alternatively, numerous viewing modes may be presented to the user. Some viewing modes may include, but are not limited to, an analysis mode (e.g. the displayed portion of data fits one screen) and a printer-friendly mode (e.g. all of the data may be placed on one long page and hyperlinks may allow cross-navigation).

Figure 4:
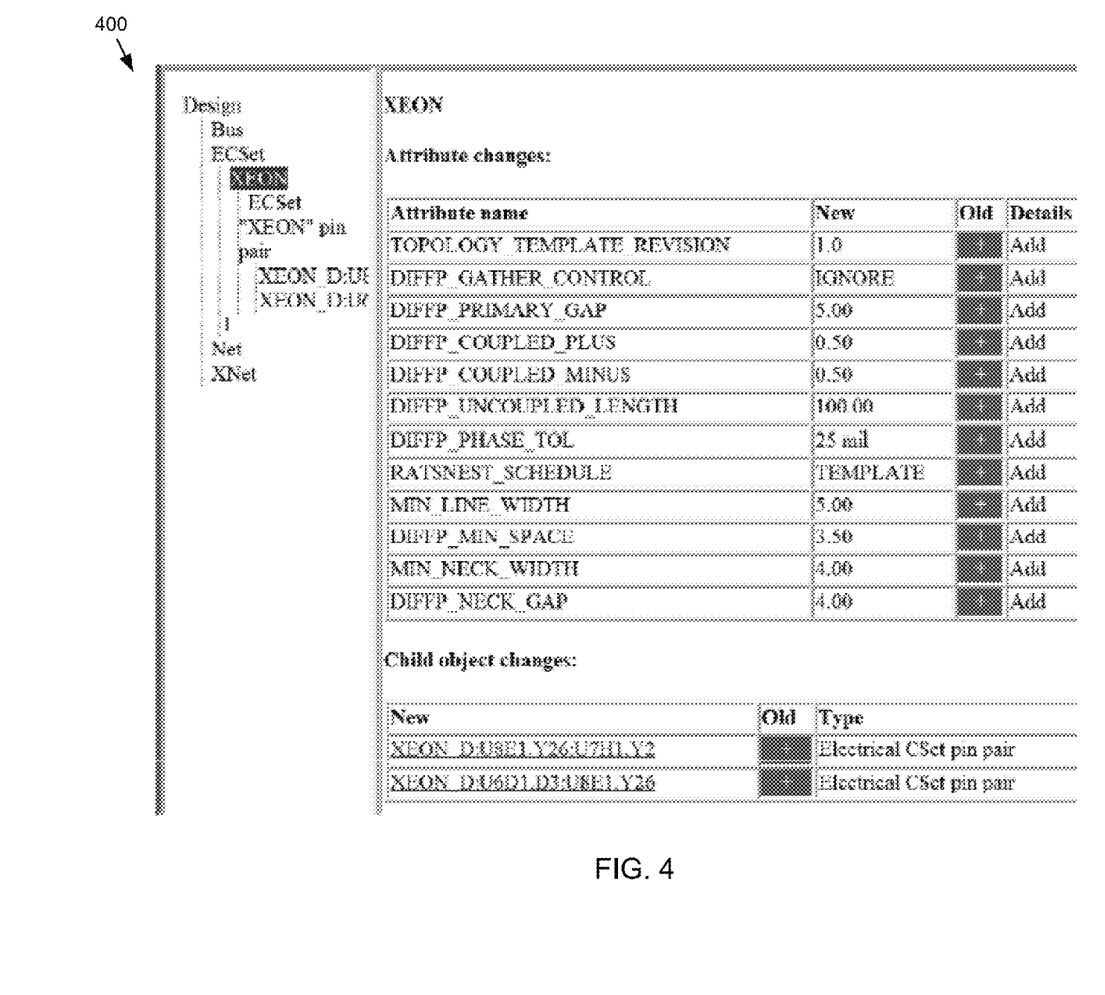
FIG. 4 is a diagram depicting an example of a report generated in accordance with an embodiment of the present disclosure.

Referring now to FIGS. 4-12, examples of reports generated in accordance with report generation process 10 are shown. As shown in FIG. 4, report generation process 10 may provide data hiding features, which may allow a user to concentrate on the differences portion being analyzed. For example, concentrating on a particular portion of the differences (e.g. introduced by a particular engineer). Additionally and/or alternatively, report generation process 10 provides hierarchical grouping, to improve difference browsing. In this way, hierarchical grouping may simplify difference browsing (e.g. may represent the differences more like the application shows the objects affected by them). The cross-navigation features associated with the generated report may allow for quick access to related differences and may provide cross-probing into the host application and the ability to manage the differences (e.g. resolving the conflicts).

Accordingly, report generation process 10 may provide a scalable, cross-platform, tool-independent solution, which provides an EDA compliant report. The XSL transformations described herein may allow leveraging the report representation outside the tool. That is, changes to the final layout of each report may not require code changes (e.g. only the XSL template).

The examples discussed in the present disclosure focus primarily upon XML, XSL and HTML. However, these formats and file types are used merely by way of example, as any suitable file type and format may be used without departing from the scope of the present disclosure. For example, report generation process 10 may write the report in any suitable format (e.g. not necessarily text), templates may also be used in any format (e.g. using a custom viewer written to perform the actual transformation of the report using the templates specified). Numerous other embodiments are also within the scope of the present disclosure.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for generating an electronic design automation constraint differences report comprising:
    modifying, using a computing device, instructions configured to generate an electronic design automation constraint differences report of an electronic design;
    generating, using the computing device, an electronic design automation data file based upon, at least in part, the modified instructions;
    converting, using the computing device, the electronic design automation data file to a second electronic design automation data file using, at least in part, an electronic design automation template; and
    generating, using the computing device, a report viewer configured to render an electronic design automation constraint differences report, based upon, at least in part, the second data file, wherein the electronic design automation constraint differences report is configured to display one or more electrical, physical, or spacing constraint differences associated with the electronic design in a hierarchical manner.

2. The computer-implemented method of claim 1, wherein the template is an Extensible Stylesheet Language (XSL) file.

3. The computer-implemented method of claim 1, wherein the data file is an Extensible Markup Language (XML) file.

4. The computer-implemented method of claim 1, wherein the second data file is an Extensible Markup Language (XML) file.

5. The computer-implemented method of claim 1, wherein generating the report viewer includes modifying instructions configured to render an electronic design automation differences report.

6. The computer-implemented method of claim 1, wherein the report viewer is a web browser-based report viewer.

7. The computer-implemented method of claim 1, wherein generating the report viewer includes providing an option of one or more viewing modes.

8. The computer-implemented method of claim 7, wherein the one or more viewing modes include at least one of an analysis mode and a printer mode.

9. A system for generating an electronic design automation constraint differences report comprising:
    a computing device having at least one processor configured to modify instructions configured to generate an electronic design automation constraint differences report of an electronic design, the at least one processor further configured to generate an electronic design automation data file based upon, at least in part, the modified instructions, the at least one processor further configured to convert the electronic design automation data file to a second electronic design automation data file using, at least in part, an electronic design automation template, the at least one processor further configured to generate a report viewer configured to render an electronic design automation constraint differences report, based upon, at least in part, the second data file, wherein the electronic design automation constraint differences report is configured to display one or more electrical, physical, or spacing constraint differences associated with the electronic design in a hierarchical manner.

10. The system of claim 9, wherein the template is an Extensible Stylesheet Language (XSL) file.

11. The system of claim 9, wherein the data file is an Extensible Markup Language (XML) file.

12. The system of claim 9, wherein the second data file is an Extensible Markup Language (XML) file.

13. The system of claim 9, wherein generating the report viewer includes modifying instructions configured to render an electronic design automation differences report.

14. The system of claim 9, wherein the report viewer is a web browser-based report viewer.

15. The system of claim 9, wherein generating the report viewer includes providing an option of one or more viewing modes.

16. The system of claim 15, wherein the one or more viewing modes include at least one of an analysis mode and a printer mode.

17. A computer-readable storage medium for generating an electronic design automation constraint differences report, the computer-readable storage medium having stored thereon instructions that when executed by a machine result in the following operations:

modifying, using a computing device, instructions configured to generate an electronic design automation constraint differences report of an electronic design;

generating, using the computing device, an electronic design automation data file based upon, at least in part, the modified instructions;

converting, using the computing device, the data file to a second electronic design automation data file using, at least in part, an electronic design automation template; and     generating, using the computing device, a report viewer configured to render an electronic design automation constraint differences report, based upon, at least in part, the second data file, wherein the electronic design automation constraint differences report is configured to display one or more electrical, physical, or spacing constraint differences associated with the electronic design in a hierarchical manner.

18. The computer-readable storage medium of claim 17, wherein the template is an Extensible Stylesheet Language (XSL) file.

19. The computer-readable storage medium of claim 17, wherein the data file is an Extensible Markup Language (XML) file.

20. The computer-readable storage medium of claim 17, wherein the second data file is an Extensible Markup Language (XML) file.

21. The computer-readable storage medium of claim 17, wherein generating the report viewer includes modifying instructions configured to render an electronic design automation differences report.

22. The computer-readable storage medium of claim 17, wherein the report viewer is a web browser-based report viewer.

23. The computer-readable storage medium of claim 17, wherein generating the report viewer includes providing an option of one or more viewing modes.

24. The computer-implemented method of claim 23, wherein the one or more viewing modes include at least one of an analysis mode and a printer mode.

* * * * *